US009674922B2

(12) United States Patent
Malon et al.

(10) Patent No.: US 9,674,922 B2
(45) Date of Patent: Jun. 6, 2017

(54) DISPLAY SIDE EDGE ASSEMBLY AND MOBILE DEVICE INCLUDING SAME

(71) Applicant: Google Technology Holdings LLC, Mountain View, CA (US)

(72) Inventors: Mark A. Malon, Wauconda (IL); Jason E. Jordan, Palatine (IL)

(73) Assignee: Google Technology Holdings LLC, Mountain View, CA (US)

( * ) Notice: Subject to any disclaimer, the term of this patent is extended or adjusted under 35 U.S.C. 154(b) by 206 days.

(21) Appl. No.: 14/034,860

(22) Filed: Sep. 24, 2013

(65) Prior Publication Data

US 2014/0265821 A1    Sep. 18, 2014

Related U.S. Application Data

(60) Provisional application No. 61/782,200, filed on Mar. 14, 2013.

(51) Int. Cl.
*H05B 33/22* (2006.01)
*H05K 7/02* (2006.01)
(Continued)

(52) U.S. Cl.
CPC ........... *H05B 33/22* (2013.01); *G06F 1/1637* (2013.01); *G06F 1/1656* (2013.01);
(Continued)

(58) Field of Classification Search
None
See application file for complete search history.

(56) References Cited

U.S. PATENT DOCUMENTS

| 4,985,878 A | 1/1991 | Yamada et al. |
| 5,416,730 A | 5/1995 | Lookofsky |

(Continued)

FOREIGN PATENT DOCUMENTS

| DE | 102009003128 A1 | 11/2010 |
| EP | 1225751 | 7/2002 |

(Continued)

OTHER PUBLICATIONS

European Patent Office, International Search Report and the Written Opinion of International Patent Application No. PCT/US2014/017331 (Sep. 1, 2014).

(Continued)

*Primary Examiner* — Jacob R Stern
(74) *Attorney, Agent, or Firm* — Wolfe-SBMC

(57) ABSTRACT

A channel frame (400) is disclosed for use with a mobile device display (204) having an upper substrate (212) with an upper surface (220), a lower substrate (210) with a lower surface (304), and an OLED layer (216) sealed between the upper substrate (212) and the lower substrate (210). The channel frame (400) includes an upper wall (502) having a lower contact surface (512), a lower wall (504) having an upper contact surface (522), and a central wall (506) connected between the upper wall (502) and the lower wall (504). The channel frame (400) forms an elongated channel having a relaxed state from which the upper wall (502) and the lower wall (504) may be flexed to permit the channel frame (400) to be coupled to a side edge of the display (204). When the channel frame (400) is adhered to a structural component of the mobile device (100), it carries the impact forces resulting from dropping the device (100) and thereby protects the display (204) from damage.

24 Claims, 5 Drawing Sheets

(51) Int. Cl.
*G06F 1/16* (2006.01)
*H04M 1/02* (2006.01)
*H04M 1/18* (2006.01)

(52) U.S. Cl.
CPC ......... *H04M 1/0266* (2013.01); *H04M 1/185* (2013.01); *H05K 7/02* (2013.01)

(56) References Cited

U.S. PATENT DOCUMENTS

| | | | |
|---|---|---|---|
| 5,479,285 | A | 12/1995 | Burke |
| 5,625,697 | A | 4/1997 | Bowen et al. |
| 5,872,744 | A | 2/1999 | Taylor |
| 5,889,737 | A | 3/1999 | Alameh et al. |
| 6,158,884 | A | 12/2000 | Lebby et al. |
| 6,382,448 | B1 | 5/2002 | Yuhara et al. |
| 6,528,203 | B1 | 3/2003 | Mitamura |
| 6,532,152 | B1 | 3/2003 | White et al. |
| 6,771,237 | B1 | 8/2004 | Kalt |
| 7,224,963 | B2 | 5/2007 | Anderson et al. |
| 7,259,155 | B2 | 8/2007 | Sakai et al. |
| 7,401,758 | B2 | 7/2008 | Liang et al. |
| 7,623,780 | B2 | 11/2009 | Takita |
| 7,766,517 | B2 | 8/2010 | Kerr et al. |
| 7,953,463 | B2 | 5/2011 | Misawa |
| 8,207,936 | B2 | 6/2012 | Gustafsson et al. |
| 8,359,020 | B2 | 1/2013 | Lebeau et al. |
| 8,456,586 | B2 | 6/2013 | Mathew et al. |
| 8,517,896 | B2 | 8/2013 | Robinette et al. |
| 8,675,124 | B2 | 3/2014 | Kawakami |
| 9,009,984 | B2 | 4/2015 | Caskey et al. |
| 9,201,454 | B2 | 12/2015 | Haupt et al. |
| 9,484,001 | B2 | 11/2016 | Dabhi |
| 9,622,365 | B2 | 4/2017 | Allore et al. |
| 2002/0103014 | A1 | 8/2002 | Hutchison et al. |
| 2003/0158593 | A1 | 8/2003 | Heilman et al. |
| 2004/0056845 | A1 | 3/2004 | Harkcom et al. |
| 2004/0250933 | A1 | 12/2004 | DeMichele |
| 2005/0285811 | A1 | 12/2005 | Kawase et al. |
| 2007/0103908 | A1 | 5/2007 | Tabito et al. |
| 2007/0273609 | A1 | 11/2007 | Yamaguchi et al. |
| 2008/0001971 | A1 | 1/2008 | Kouninski |
| 2008/0074551 | A1 | 3/2008 | Kawakami |
| 2008/0094515 | A1 | 4/2008 | Gutta et al. |
| 2008/0204367 | A1 | 8/2008 | Lafarre et al. |
| 2008/0285290 | A1 | 11/2008 | Ohashi et al. |
| 2008/0291225 | A1 | 11/2008 | Arneson |
| 2008/0303782 | A1 | 12/2008 | Grant et al. |
| 2008/0309589 | A1 | 12/2008 | Morales |
| 2008/0309861 | A1 | 12/2008 | Seki et al. |
| 2009/0195959 | A1 | 8/2009 | Ladouceur et al. |
| 2009/0254869 | A1 | 10/2009 | Ludwig et al. |
| 2010/0053174 | A1 | 3/2010 | Cohen et al. |
| 2010/0056223 | A1 | 3/2010 | Choi et al. |
| 2010/0225600 | A1 | 9/2010 | Dai et al. |
| 2010/0231692 | A1 | 9/2010 | Perlman et al. |
| 2010/0238367 | A1 | 9/2010 | Montgomery et al. |
| 2010/0265431 | A1 | 10/2010 | Li |
| 2010/0328571 | A1* | 12/2010 | Itaya ................. G02F 1/133308 349/58 |
| 2011/0109538 | A1 | 5/2011 | Kerr et al. |
| 2011/0221656 | A1 | 9/2011 | Haddick et al. |
| 2011/0242750 | A1 | 10/2011 | Oakley |
| 2011/0255303 | A1 | 10/2011 | Nichol et al. |
| 2012/0038613 | A1 | 2/2012 | Choi |
| 2012/0044131 | A1 | 2/2012 | Nussbächer et al. |
| 2012/0055553 | A1 | 3/2012 | Logunov et al. |
| 2012/0091923 | A1* | 4/2012 | Kastner-Jung ........... B60Q 7/00 315/360 |
| 2012/0112994 | A1 | 5/2012 | Vertegaal et al. |
| 2012/0177953 | A1 | 7/2012 | Bhardwaj et al. |
| 2012/0242592 | A1 | 9/2012 | Rothkopf et al. |
| 2013/0053661 | A1 | 2/2013 | Alberth et al. |
| 2013/0076649 | A1 | 3/2013 | Myers et al. |
| 2013/0127733 | A1 | 5/2013 | Krishnaswamy |
| 2013/0278631 | A1 | 10/2013 | Border et al. |
| 2013/0307419 | A1 | 11/2013 | Simonian et al. |
| 2013/0329460 | A1* | 12/2013 | Mathew ................. H05K 5/02 362/612 |
| 2014/0063049 | A1 | 3/2014 | Armstrong-Muntner |
| 2014/0063055 | A1 | 3/2014 | Osterhout et al. |
| 2014/0240903 | A1 | 8/2014 | Allore et al. |
| 2014/0265821 | A1* | 9/2014 | Malon ................. H05B 33/22 313/504 |
| 2014/0285967 | A1 | 9/2014 | Wikander et al. |
| 2014/0368981 | A1 | 12/2014 | Haupt et al. |
| 2014/0372940 | A1 | 12/2014 | Cauwels et al. |
| 2015/0138505 | A1 | 5/2015 | Grenon et al. |
| 2015/0179141 | A1 | 6/2015 | Dabhi |
| 2017/0046054 | A1 | 2/2017 | Cauwels et al. |

FOREIGN PATENT DOCUMENTS

| | | |
|---|---|---|
| EP | 2500898 | 9/2012 |
| GB | 2327012 | 1/1999 |
| WO | WO-9624093 | 8/1996 |
| WO | WO-0025193 | 5/2000 |
| WO | 2008057143 A1 | 5/2008 |
| WO | WO-2011121403 | 10/2011 |

OTHER PUBLICATIONS

"Final Office Action", U.S. Appl. No. 13/455,921, Jun. 13, 2014, 18 pages.

"Final Office Action", U.S. Appl. No. 13/455,921, Oct. 7, 2015, 19 pages.

"Final Office Action", U.S. Appl. No. 13/893,533, Jul. 30, 2015, 15 pages.

"Final Office Action", U.S. Appl. No. 14/139,485, Oct. 16, 2015, 11 pages.

"International Preliminary Report on Patentability", Application No. PCT/US2013/034760, Nov. 6, 2014, 10 pages.

"International Search Report and Written Opinion", Application No. PCT/US2014/012739, May 9, 2014, 11 pages.

"International Search Report and Written Opinion", Application No. PCT/US2013/034760, Jun. 28, 2013, 13 pages.

"International Search Report and Written Opinion", Application No. PCT/US2012/064300, Apr. 11, 2013, 14 pages.

"Non-Final Office Action", U.S. Appl. No. 13/297,662, Jun. 2, 2014, 12 pages.

"Non-Final Office Action", U.S. Appl. No. 13/455,921, Feb. 24, 2015, 17 pages.

"Non-Final Office Action", U.S. Appl. No. 13/455,921, Dec. 18, 2013, 15 pages.

"Non-Final Office Action", U.S. Appl. No. 13/893,533, Mar. 2, 2015, 14 pages.

"Non-Final Office Action", U.S. Appl. No. 13/893,533, Dec. 18, 2015, 22 pages.

"Non-Final Office Action", U.S. Appl. No. 14/139,485, May 26, 2015, 10 pages.

"Non-Final Office Action", U.S. Appl. No. 14/474,808, Jan. 12, 2016, 9 pages.

"Notice of Allowance", U.S. Appl. No. 14/082,733, Feb. 18, 2015, 7 pages.

"Notice of Allowance", U.S. Appl. No. 14/082,733, Jul. 27, 2015, 7 pages.

"Restriction Requirement", U.S. Appl. No. 13/297,662, Nov. 14, 2013, 5 pages.

Kee,"Bendable batteries in the pipeline?", Ubergizmo, http://www.ubergizmo.com/2011/02/bendable-batteries-in-the-pipeline/, Feb. 28, 2011, 2 pages.

Tan,"Exploiting the Cognitive and Social Benefits of Physically Large Displays", Carnigie Mellon University CMU-CS-04-154, Aug. 2004, 201 pages.

"Non-Final Office Action", U.S. Appl. No. 14/139,485, Mar. 10, 2016, 11 pages.

"Final Office Action", U.S. Appl. No. 13/893,533, May 5, 2016, 22 pages.

(56) References Cited

OTHER PUBLICATIONS

"Final Office Action", U.S. Appl. No. 14/474,808, Jun. 2, 2016, 15 pages.
"Final Office Action", U.S. Appl. No. 14/139,485, Jul. 7, 2016, 5 pages.
"Advisory Action", U.S. Appl. No. 14/474,808, Sep. 19, 2016, 2 pages.
"Advisory Action", U.S. Appl. No. 13/893,533, Sep. 14, 2016, 3 pages.
"Notice of Allowance", U.S. Appl. No. 13/893,533, Dec. 2, 2016, 8 pages.
"Corrected Notice of Allowance", U.S. Appl. No. 13/893,533, Jan. 12, 2017, 5 pages.

* cited by examiner

DISPLAY SIDE EDGE ASSEMBLY AND MOBILE DEVICE INCLUDING SAME

TECHNICAL FIELD

The present disclosure relates in general to construction of mobile devices, and, in particular, to designs for attaching a display assembly to a device having reduced side borders to prevent damage to the display when the device is dropped.

BACKGROUND

Display size on mobile devices, such as smart phones, personal digital assistants, etc., is a key design parameter. In particular, some designs seek to maximize the size of the display relative to the overall device footprint (i.e., minimize the non-viewable area around the display). This requires a reduction in the width of the side borders of the device. One consequence of side border reduction, however, is weakening of the connection between the device housing and the display assembly structure, which includes an outer glass lens adhered to the housing and bonded to an organic light-emitting diode ("OLED") display using liquid optically-clear adhesive ("LOCA"). Normally, the lens to housing adhesive around the borders of the lens carries most of the mechanical shock forces imparted to the display assembly when the device is dropped. If the side border area is reduced, then the area of adhesive used between the lens and the housing may also be reduced, resulting in an unacceptably weak mechanical connection between the housing and the display assembly.

One option for strengthening the mechanical connection is to add adhesive directly between the OLED display and another structural component of the device disposed below the OLED display. This, however, requires the display to carry forces imparted to the device when dropped. In particular, the shock forces would be transferred to the glass frit border lamination used to hermetically edge-seal the moisture sensitive OLED layer sandwiched between two impermeable, rigid substrates (often made of glass). If the OLED display is adhered directly to the device, then the frit border will be susceptible to de-lamination from pull forces when the device is dropped.

DETAILED DESCRIPTION OF EXEMPLARY EMBODIMENTS

Figure 1:
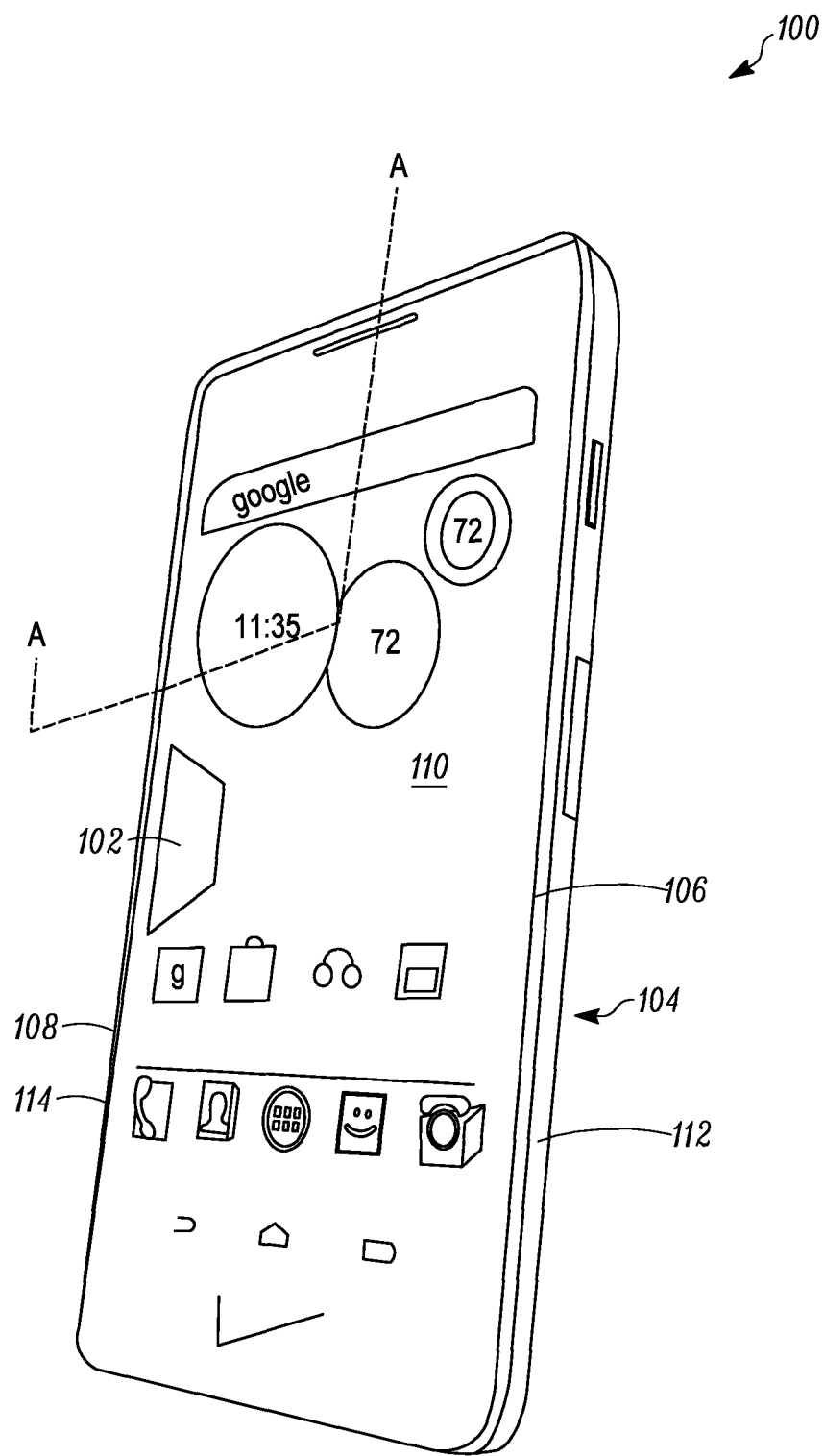
FIG. 1 is a perspective view of a mobile device.

Briefly, in a specific embodiment, for a mobile device having reduced side borders (to decrease non-viewable area), a "C" or "E" shaped resilient channel frame is attached to each side of the display and adhered to a structural component of the device. These channel frames, and to a smaller extent the reduced-area adhesive connection between the lens perimeter and the device housing, carry the forces imparted to the display assembly when the device is dropped. The channel frame is shaped to permit curing of the LOCA layer between the lens and the OLED display, and to avoid contact with the squared edges of the OLED display. Among other things, the channel frames permit a reduction in side border areas while maintaining a sufficiently strong mechanical connection between the display assembly and the device without increasing the likelihood of damage to the assembly when the device is dropped.

In one embodiment of the disclosure, a display assembly is provided comprising: a display including an edge; and a channel frame coupled to the edge and including an upper wall, a lower wall, and a central wall connecting the lower wall and the upper wall, the channel frame being constructed such that the upper wall applies an upper retaining force to an upper surface of the display and the lower wall applies a lower retaining force to a lower surface of the display. In one example, the upper wall is curved such that only a lower contact surface of the upper wall engages the upper surface of the display. In another example, the central wall of the channel frame comprises an upper bend connected to the upper wall, a lower bend connected to the lower wall, and a central bend connected to the upper bend and the lower bend, the bends permitting flexing of the upper wall and the lower wall away from one another such that when the walls are released upon coupling the channel frame to the display edge, the upper wall applies the upper retaining force to the upper surface of the display and the lower wall applies the lower retaining force to the lower surface of the display. In a variant of this example, the upper bend is formed to avoid contact with a squared transition between the upper surface of the display and the edge and the lower bend is formed to avoid contact with a squared transition between the lower surface of the display and the edge.

In another embodiment of the disclosure, a display assembly for a mobile device is provided comprising: a display including an upper substrate, a lower substrate, an OLED layer between the upper substrate and the lower substrate, and a frit layer disposed about a perimeter of the OLED layer between the upper substrate and the lower substrate, the display having a pair of side edges; and a channel frame having an upper wall with a lower contact surface, a lower wall with an upper contact surface, and a central wall connecting the upper wall to the lower wall; wherein the channel frame is mounted onto a side edge of the display such that the lower contact surface engages the upper substrate and the upper contact surface engages the lower substrate. In one example, the assembly further comprises adhesive disposed between the lower wall of the channel frame and a structural component of the device, thereby forming a mechanical connection between the assembly and the device such that the channel frame carries impact forces imparted to the assembly when the device is dropped. In a variant, a lens is adhered to the upper substrate, and an adhesive is disposed between a lower surface of the lens and a pair of ledges formed by side borders of a housing of the device. In another example, the channel frame is constructed to permit flexing of the upper wall and the lower wall away from one another such that the channel frame may be clamped over a side edge of the display. In yet another example, the frit layer is disposed between the lower contact surface of the upper wall and the upper contact surface of the lower wall. In still another example, the central wall includes an upper bend connected to the upper wall and having an upper surface, a lower bend connected to the lower wall, and a central bend connected to the upper bend and the lower bend. In a variant of this example, the assembly further comprises a polarizer connected to an upper surface of the upper substrate, wherein a vertical distance between the upper surface of the upper bend and the lower contact surface of the upper wall is less than a vertical dimension of the polarizer. In another variant, the upper bend is formed to avoid contact with a squared transition between an upper surface of the upper substrate and a side edge of the display and the lower bend is formed to avoid contact with a squared transition between a lower surface of the lower substrate and the side edge of the display. In another example, the assembly further comprises adhesive disposed between the central wall of the channel frame and a side edge of the display.

In still another embodiment of the present disclosure, a mobile device is provided comprising: a housing; and a display assembly including a pair of side edges, and a pair of channel frames mounted onto the side edges of the display, each channel frame including a lower wall, an upper wall, and a central wall connecting the lower wall and the upper wall; wherein the display assembly is mechanically connected to the housing by adhesive between the lower walls of the channel frames and at least one structural component of the housing. In one example, the device further comprises a lens attached to the display by a liquid optically-clear adhesive, and an adhesive disposed between a lower surface of the lens and a pair of ledges formed by side borders of the housing. In another example, each channel frame is constructed as an elongated channel that permits flexing of the upper wall and the lower wall away from one another such that the channel frame may be clamped over a side edge of the display. In still another example, the display includes an upper substrate having an upper surface, a lower substrate having a lower surface, and an OLED layer sealed between the upper substrate and the lower substrate by a frit layer disposed around a perimeter of the OLED layer between the upper substrate and the lower substrate, the upper wall of each channel frame including a lower contact surface that engages the upper surface of the upper substrate, and the lower wall of each channel frame including an upper contact surface that engages the lower surface of the lower substrate. In a variant of this example, the frit layer is disposed vertically between the lower contact surface of the upper wall and the upper contact surface of the lower wall of each channel frame. In another example, the central wall of each channel frame includes an upper bend connected to the upper wall and having an upper surface, a lower bend connected to the lower wall, and a central bend connected to the upper bend and the lower bend. In a variant of this example, the display assembly further comprises a polarizer connected to an upper surface of the display, and defining a pair of ledges therewith, the upper wall of each channel frame being mounted onto one of the pair of ledges and having a vertical distance between the upper surface of the upper bend and a lower contact surface of the upper wall is less than a maximum vertical dimension of the ledge. In further variant, the upper bend is formed to avoid contact with a squared transition between the upper surface of the display and a side edge of the display and the lower bend is formed to avoid contact with a squared transition between a lower surface of the display and the side edge of the display. In another example, the device further comprises adhesive disposed between the central wall of each channel frame a corresponding side edge of the display.

In still another embodiment of the present disclosure, a channel frame is provided for use with a mobile device OLED display having an upper substrate with an upper surface, a lower substrate with a lower surface, and an OLED layer sealed between the upper substrate and the lower substrate, the channel frame comprising: an upper wall having a lower contact surface; a lower wall having an upper contact surface; and a central wall having an upper bend connected to the upper wall, a lower bend connected to the lower wall, and a central bend extending between the upper bend and the lower bend; wherein the upper wall, the lower wall and the central wall form an elongated channel having a relaxed state in which a distance between the lower contact surface and the upper contact surface is less than a distance between the upper surface of the upper substrate and the lower surface of the lower substrate; the channel frame being configured such that the upper wall and the lower wall may be flexed apart from one another to permit placement of the channel frame onto a side edge of the display, and released such that the channel frame moves toward the relaxed state and the lower contact surface engages the upper surface of the upper substrate and the upper contact surface engages the lower surface of the lower substrate, thereby clamping the channel frame to the display. In one example, the channel frame further comprises adhesive disposed between the lower wall of the channel frame and a structural component of the device, thereby forming a mechanical connection between the display and the device such that the channel frame carries impact forces imparted to the display when the device is dropped. In another example, the lower contact surface of the upper wall engages the upper surface of the upper substrate at a location vertically above a frit layer between the upper substrate and the lower substrate, and the upper contact surface of the lower wall engages the lower surface of the lower substrate at a location vertically below the frit layer. In yet another example, a vertical distance between an upper surface of the upper bend and the lower contact surface of the upper wall is less than a vertical dimension of a polarizer adhered to the display. In another example, the upper bend is formed to avoid contact with a squared transition between the upper surface of the upper substrate and the side edge of the display and the lower bend is formed to avoid contact with a squared transition between the lower surface of the lower substrate and the side edge of the display. In still another example, the channel frame further comprises adhesive disposed between the central wall of the channel frame and the side edge of the display.

Turning now to the drawings, FIG. 1 depicts a mobile device 100 including a lens/display assembly 102 mounted within a housing 104. A pair of side borders 106, 108 are disposed between a viewing area 110 of lens/display assembly 102 and the outermost side edges 112, 114 of device 100.

Figure 2:
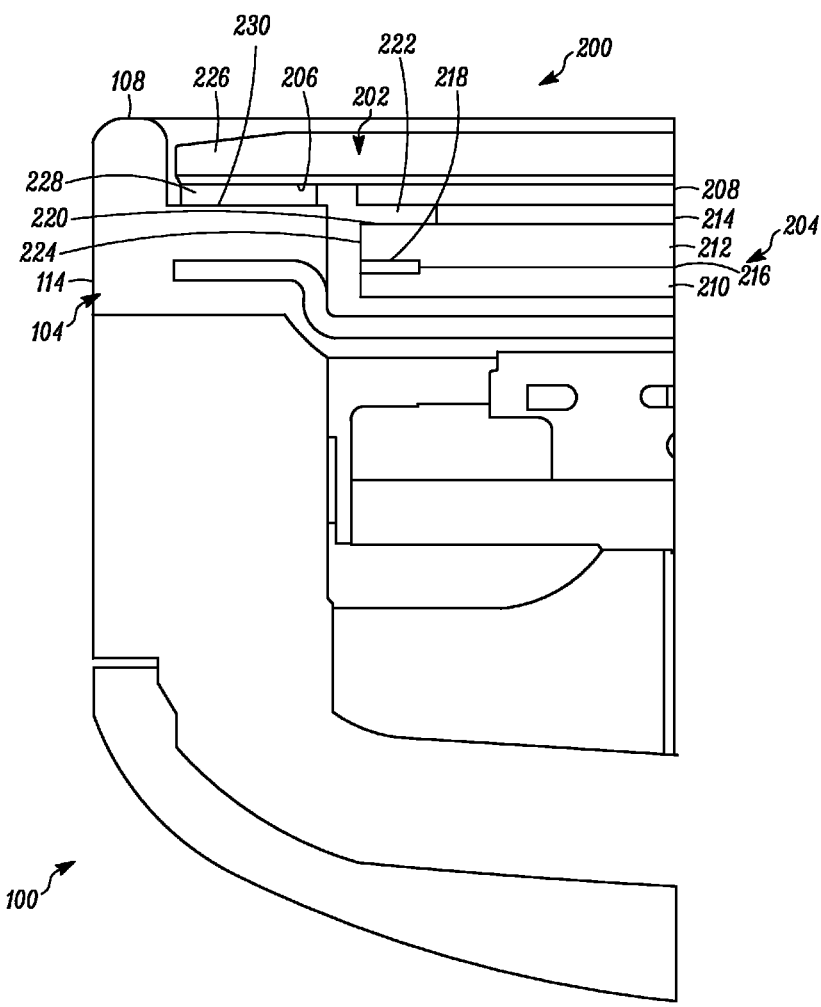
FIG. 2 is a sectional end view taken along line A-A of FIG. 1, but depicting a prior art approach for mounting a display assembly mounted therein.

FIG. 2 depicts a prior art approach for mounting a lens/display assembly to a mobile device. FIG. 2 is a sectional, end view taken along line A-A of FIG. 1, but depicting this prior art approach. In FIG. 2, the lens/display assembly 200 generally includes an outer, optical lens 202 and an OLED display 204. A lower surface 206 of lens 202 is bonded to display 204 by a liquid optically-clear adhesive ("LOCA") layer 208. Display 204 includes, among other things, a lower substrate 210 (typically glass), an upper substrate 212 (typically glass) and a polarizer 214. An OLED layer 216 is disposed between lower substrate 210 and upper substrate 212. OLED layer 216 is sealed between lower substrate 210 and upper substrate 212 by a glass frit border lamination layer 218 according to known principles. Polarizer 214 is bonded to the upper surface 220 of upper substrate 212 over touch panel lines (not shown), thereby protecting them from the environment. The border of the upper surface 220 of upper substrate 212 is not covered by polarizer 214. Accordingly, an outer ledge 222 (only one shown) is formed on each side of display 204, bounded from above by LOCA layer 208, from below by upper surface 220, and from the side by polarizer 214. Finally, upper substrate 212 and lower substrate 210 terminate at side edges 224 (only one shown) of display 204.

Assembly 200 is attached to mobile device 100 at the perimeter 226 of lens 202. More specifically, adhesive 228 is provided about the perimeter of lower surface 206 to adhere assembly 200 to ledges 230 (only one shown) formed on the side borders 106, 108 (only border 108 is shown) of housing 104 of device 100. In this manner, display 204 of assembly 200 is suspended within housing 104 by lens 202, which has sufficient structural rigidity at its connections to ledges 230 to withstand shock forces associated with dropping of device 100.

Figure 3:
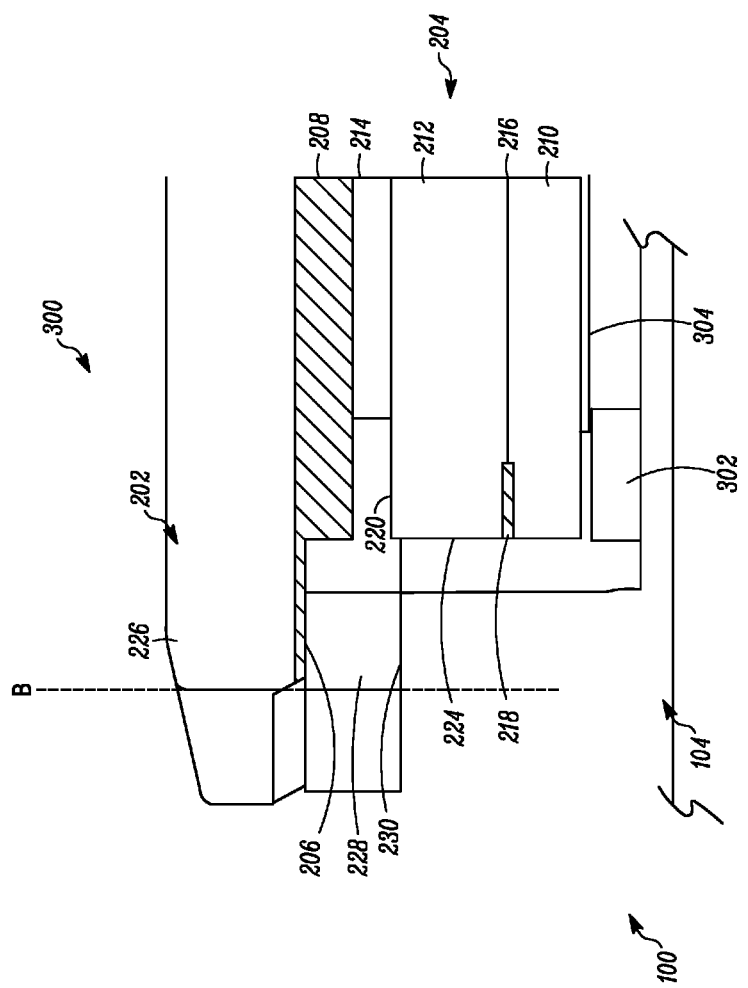
FIG. 3 is a sectional end view taken alone line A-A of FIG. 1, but depicting a reduced side border device design having a display assembly adhered directly to a structural component of the device.

Referring now to FIG. 3, portions of the structure of FIG. 2 are shown to indicate changes resulting from a reduction in the width of side borders 106, 108 of housing 104. Specifically, the portion of housing 204, ledge 230 and lens 202 to the left of line B is removed in a reduced-border design. Side border 108 is not shown. The remaining ledge 230 has a reduced area, thereby requiring a reduction in adhesive 228 bonding lens 202 to ledge 230 by an amount that will result in an unacceptably weak structural connection between assembly 300 and housing 104.

FIG. 3 also depicts a potential, but unacceptable approach to strengthening this structural connection. In particular, this approach would add adhesive 302 directly to the lower surface 304 of lower substrate 210 of display 204. Unfortunately, while adhesive 302 will strengthen the mechanical connection between assembly 300 and device 100, it will also result in the direct transfer of forces to display 204 when device 100 is dropped. Among other problems, this application of force to display 204 may result in de-lamination of frit layer 218, thereby causing unacceptable damage to display 204.

Figure 4:
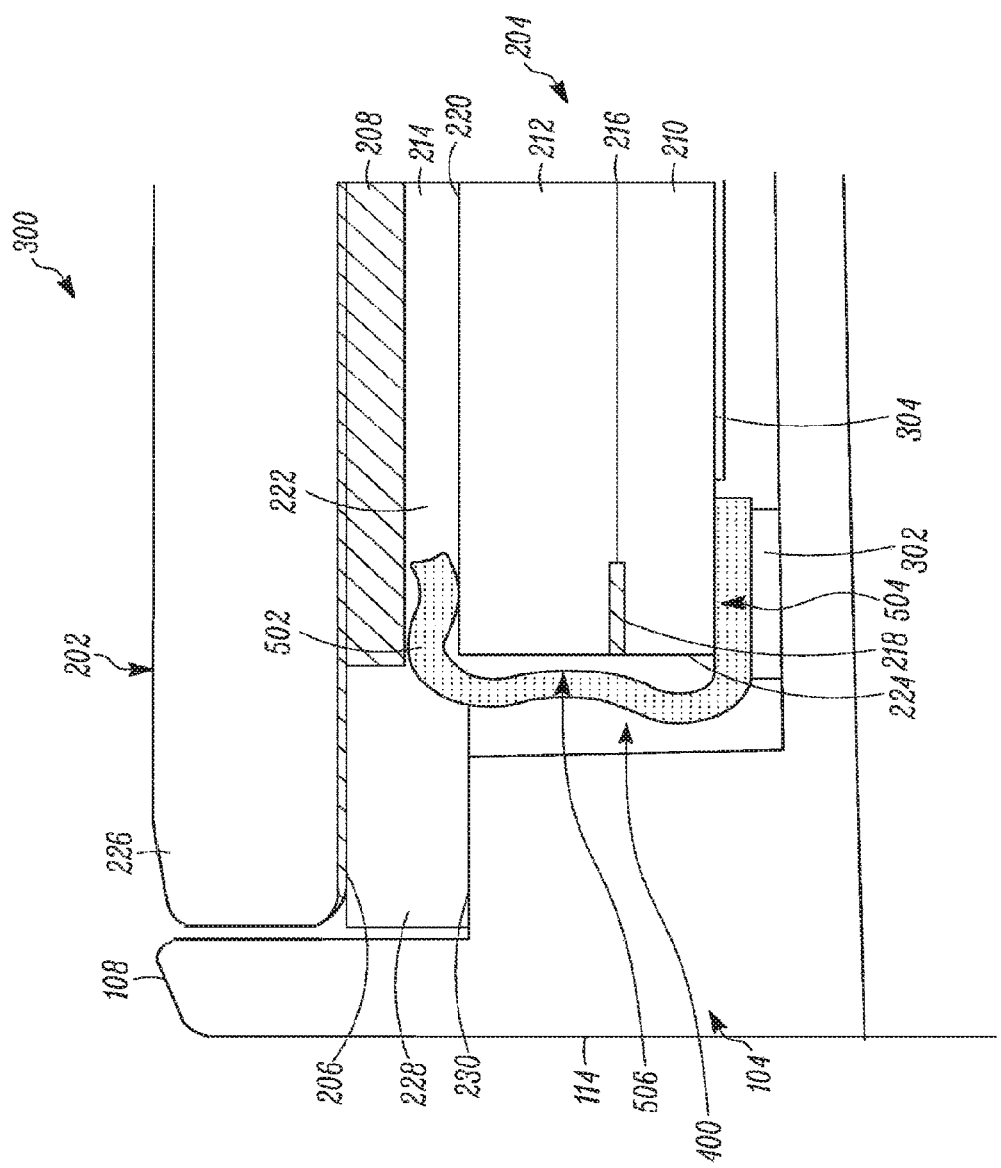
FIG. 4 is a sectional end view taken along line A-A of FIG. 1, and depicting a reduced side border device design having a display assembly mounted therein according to one embodiment of the present disclosure.

According to one embodiment of the present disclosure as depicted in FIG. 4, instead of direct application of adhesive 302 to lower substrate 210, a channel frame 400 is attached to one or both side edges 224 of display 204 in a manner further described below, and adhesive 302 is used between channel frame(s) 400 and a structural component of device 100 (i.e., adhesive 302 adheres frame(s) 400 directly or indirectly through other appropriate and suitable structure to housing 104). In one embodiment of the disclosure, adhesive 302 is approximately 0.10 mm thick, and adhesive 228 is approximately 0.40 mm thick. Adhesive may also be used between channel frame 400 and the side edges 224 of display 204 (i.e., adhesive may be applied inside channel frame 400) such that channel frame 400 is adhered to display 204 in addition to being clamped onto display 204 as a result of its partially resilient construction as is further described below. Adhesive 302 and adhesive 228 may be the same or different types of adhesive. In one embodiment, adhesive 228 is a lens foam adhesive such as product number 57140 manufactured by Nitto Denko Corporation and adhesive 302 is a tape adhesive such as product number 57210 manufactured by Nitto Denko Corporation. It should be understood, however, that any of a variety of different adhesives (PSAs or even liquid adhesives) may be used.

Channel frame 400 is formed as an elongate channel, which, in one embodiment, extends substantially the length of side edge 224 of display 204. It should be understood, however, that two or more reduced length frames 400 may be used on one or both side edges 224 of display 204. In one embodiment, channel frame 400 is formed from 0.12 mm stainless steel, and because of its construction, has the characteristic of a semi-resilient spring as is further described below.

Figure 5:
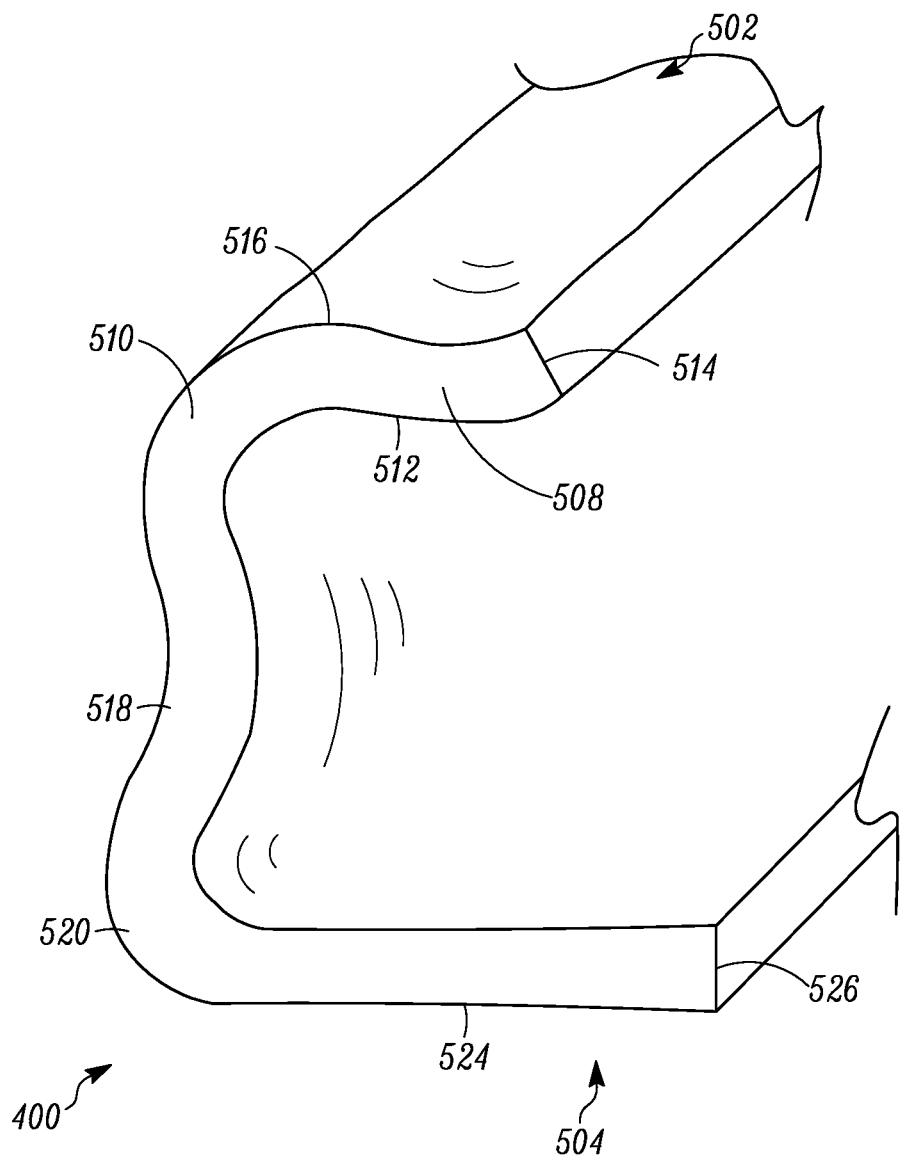
FIG. 5 is a partially fragmented perspective view of a channel frame according to one embodiment of the present disclosure.

Referring now to FIG. 5, channel frame 400 generally includes an upper wall 502 and a lower wall 504 connected together by a central wall 506. Upper wall 502 of channel frame 400 includes curved portion 508 extending from an upper bend 510 of central wall 506. Curved portion 508 includes a lower contact surface 512, which in use contacts upper surface 220 of upper substrate 212, and terminates at an outer edge 514. The curved shape of curved portion 508 results in an upward lift of outer edge 514. This shape prevents contact between curved portion 508 and the touch panel lines (not shown) disposed on upper surface 220 of upper substrate, permits curved portion 508 to be more easily slid onto side 224 of display 204 during assembly, and provides, in part, the flexing of channel frame 400 described herein to accommodate tolerance stack-ups of the various components of display 204.

Upper bend 510 of central wall 506 includes an upper edge 516 and extends into a central bend 518, which extends into a lower bend 520. Upper bend 510, central bend 518, and lower bend 520 also enable the flexing described herein. Lower wall 504 of channel frame 400 is substantially planar and extends from lower bend 520 of central wall 506. Lower wall 504 includes an upper contact surface 522, which in use contacts lower surface 304 of lower substrate 210, a lower surface 524, and terminates at an outer edge 526.

As indicated above, the construction of channel frame 400 permits a small amount of flexing between upper wall 502 and lower wall 504. More specifically, when channel frame 400 is in a relaxed state, the distance between upper contact surface 522 of lower wall 504 and lower contact surface 512 of upper wall 502 is less than the distance between the lower surface 304 of lower substrate 210 and the upper surface 220 of upper substrate 212. When channel frame 400 is attached to display 204, upper wall 502 and lower wall 504 are flexed away from each other, channel frame 400 is placed onto display 204 as shown in FIG. 4, and the walls 502, 504 are released. The biasing force of channel frame 400 toward its relaxed state functions to couple channel frame 400 onto display 204 such that lower contact surface 512 remains in contact with upper surface 220 of upper substrate 212 and upper contact surface 522 remains in contact with lower surface 304 of lower substrate 210 during assembly. Additionally, channel frame 400 is formed such that lower contact surface 512 is vertically aligned above frit layer 218 and upper contact surface 522 is vertically aligned below frit layer 218. In this manner, forces imparted to assembly 300 as a result of dropping device 100 are absorbed by the flexing of channel frame 400 rather than being transferred to the areas of display 204 (i.e., frit layer 218) most likely to delaminate as a result of such forces.

Referring back to FIG. 4, it should be recognized that upper wall 502 of channel frame 400 and upper bend 510 of central wall 506 do not exceed the vertical dimension of ledge 222, which corresponds to the thickness of polarizer 214. In other words, the vertical distance between the upper edge 516 of upper bend 510 and lower contact surface 512 does not exceed the vertical distance of polarizer 214. This feature of channel frame 400 according to the present disclosure permits access of UV light from the sides of assembly 300 to cure the LOCA layer 208 during assembly.

It should be further recognized that the shape of channel frame 400 avoids contact with the scribed square edges of upper substrate 212 and lower substrate 210 of display 204. More specifically, upper bend 510 of central wall 506 curves outwardly relative to the squared transition between upper surface 220 of upper substrate 212 and side edge 224 and lower bend 520 of central wall 506 curves outwardly relative to the squared transition between lower surface 304 of lower substrate 210 and side edge 224. In this manner, potential damage to the edges of substrates 210, 212 from a transfer of impact forces from channel frame 400 to display 204 is essentially eliminated.

With adhesive 302 disposed between lower surface 524 of lower wall 504 and a structural component (such as housing 104) of device 100, in addition to adhesive 228 disposed between lower surface 206 of lens 202 and ledge 230, forces which otherwise would potentially damage display 204 when device 100 is dropped are carried by channel frame 400 and lens 202. The primary path for transmission of such forces is through channel frame 400. The connection between lens 202 and housing 104 through adhesive 228 constitutes a secondary path. In certain embodiments, the primary purpose of adhesive 228 is to prevent dust and other contaminants from reaching assembly 300 and other internal components of device 100.

Accordingly, the design of the present disclosure permits reduction in side border area (i.e., a reduction of the non-viewing area of device 100) without increasing the potential for damage to display 204 when device 100 is dropped. Moreover, the construction of channel frame 400 permits continued side-curing of LOCA layer 214 and avoids metal-to-glass contact at the squared edges of display 204.

The foregoing description has been presented for the purposes of illustration and description. It is not intended to be exhaustive or to limit the disclosure to the exemplary embodiments disclosed. Many modifications and variations are possible in light of the above teachings. It is intended that the scope of the invention be limited not by this detailed description of examples, but rather by the claims appended hereto.

What is claimed is:

1. A mobile device, comprising:
    a housing; and
    a display assembly including:
        a display having a side edge, an upper surface, and a squared transition between the upper surface and the side edge; and
        a channel frame mounted onto the side edge, the channel frame including:
            a lower wall;
            an upper wall; and
            a central wall, the central wall:
                connecting the lower wall and the upper wall;
                having an upper bend connected to the upper wall;
                having a lower bend connected to the lower wall; and
                having a central bend connected to the upper bend and the lower bend,
            the upper bend of the central wall formed to avoid contact with the squared transition between the upper surface of the display and the side edge of the display and the central bend of the central wall formed to curve towards the side edge of the display effective to absorb forces through flexing of the central bend;
    the display assembly mechanically connected to the housing.

2. The device of claim 1, further comprising a lens attached to the display by a liquid optically-clear adhesive, and an adhesive disposed between a lower surface of the lens and a pair of ledges formed by side borders of the housing.

3. The device of claim 1, wherein the channel frame is constructed as an elongated channel that permits flexing of the upper wall and the lower wall away from one another such that the channel frame may be clamped over the side edge of the display.

4. The device of claim 1, wherein the display includes an upper substrate having the upper surface, a lower substrate having the lower surface, and an OLED layer sealed between the upper substrate and the lower substrate by a frit layer disposed around a perimeter of the OLED layer between the upper substrate and the lower substrate, the upper wall of the channel frame including a lower contact surface that engages the upper surface of the upper substrate, and the lower wall of the channel frame including an upper contact surface that engages the lower surface of the lower substrate.

5. The device of claim 4, wherein the frit layer is disposed vertically between the lower contact surface of the upper wall and the upper contact surface of the lower wall of the channel frame.

6. The device of claim 1, wherein the display assembly further comprises a polarizer connected to the upper surface of the display, and defining a pair of ledges therewith, the upper wall of the channel frame being mounted onto one of the pair of ledges and having a vertical distance between the upper surface of the upper bend and a lower contact surface of the upper wall is less than a maximum vertical dimension of the ledge.

7. The device of claim 1, further comprising adhesive disposed between the central wall of the channel frame and the side edge of the display.

8. The device of claim 1, wherein the forces are absorbed through a contact by the central bend with the side edge.

9. The device of claim 8, wherein the channel frame is a semi-resilient spring, the semi-resilient spring capable of absorbing the forces.

10. The device of claim 1, wherein the lower bend curves outward from a square transition between a lower surface of the display and a second squared transition between the lower surface and the side edge, the lower bend's outward curve formed to avoid contact with the second squared transition.

11. The device of claim 10, wherein the central bend and the lower bend are formed such that the central bend contacts the side edge prior to the lower bend contacting the second squared transition.

12. The device of claim 1, wherein the display assembly is mechanically connected to the housing by adhesive between the lower wall of the channel frame and at least one structural component of the housing.

13. A mobile device, comprising:
    a housing; and
    a display assembly including:
        a display having a side edge, an upper surface, and a squared transition between the upper surface and the side edge; and
        a channel frame mounted onto the side edge, the channel frame including:
            a lower wall;

an upper wall having a curved portion formed to curve towards the top edge of the display effective to absorb forces through flexing of the curved portion; and a central wall, the central wall:
  connecting the lower wall and the upper wall;
  having an upper bend connected to the upper wall;
  having a lower bend connected to the lower wall; and
  having a central bend connected to the upper bend and the lower bend,
  the upper bend of the central wall formed to avoid contact with the squared transition between the upper surface of the display and the side edge of the display;
the display assembly mechanically connected to the housing.

14. The device of claim 13, wherein the curved portion of the upper wall contains a lower contact surface that contacts the upper surface of the display.

15. The device of claim 14, wherein the lower contact surface is tangent to the curved portion.

16. The device of claim 13, further comprising a lens attached to the display by a liquid optically-clear adhesive, and an adhesive disposed between a lower surface of the lens and a pair of ledges formed by side borders of the housing.

17. The device of claim 13, wherein the channel frame is constructed as an elongated channel that permits flexing of the upper wall and the lower wall away from one another such that the channel frame may be clamped over the side edge of the display.

18. The device of claim 13, wherein the display includes an upper substrate having the upper surface, a lower substrate having the lower surface, and an OLED layer sealed between the upper substrate and the lower substrate by a frit layer disposed around a perimeter of the OLED layer between the upper substrate and the lower substrate, the upper wall including a lower contact surface that engages the upper surface of the upper substrate, and the lower wall of the channel frame including an upper contact surface that engages the lower surface of the lower substrate.

19. The device of claim 18, wherein the frit layer is disposed vertically between the lower contact surface of the upper wall and the upper contact surface of the lower wall of the channel frame.

20. The device of claim 13, wherein the display assembly further comprises a polarizer connected to the upper surface of the display, and defining a pair of ledges therewith, the upper wall of the channel frame being mounted onto one of the pair of ledges and having a vertical distance between the upper surface of the upper bend and a lower contact surface of the upper wall is less than a maximum vertical dimension of the ledge.

21. The device of claim 13, further comprising adhesive disposed between the central wall of the channel frame and the side edge of the display.

22. The device of claim 13, wherein the channel frame is a semi-resilient spring, the semi-resilient spring capable of absorbing the forces.

23. The device of claim 13, wherein the lower bend curves outward from a square transition between a lower surface of the display and a second squared transition between the lower surface and the side edge, the lower bend's outward curve formed to avoid contact with the second squared transition.

24. The device of claim 13, wherein the display assembly is mechanically connected to the housing by adhesive between the lower wall of the channel frame and at least one structural component of the housing.

* * * * *